United States Patent [19]
Babineau et al.

[11] Patent Number: 6,115,263
[45] Date of Patent: Sep. 5, 2000

[54] PANEL HAVING FINGERS ADAPTED TO RETAIN PRINTED CIRCUIT BOARD MODULAR DEVICE CARRIER ASSEMBLY

[75] Inventors: Paul J. Babineau, Ashburnham; David E. Maloney, Medway, both of Mass.

[73] Assignee: 3Com Corporation, Santa Clara, Calif.

[21] Appl. No.: 09/395,842

[22] Filed: Sep. 14, 1999

Related U.S. Application Data

[60] Provisional application No. 60/128,508, Apr. 9, 1999.

[51] Int. Cl.$^7$ .................................................. H05K 7/14
[52] U.S. Cl. ......................... 361/796; 361/752; 361/753; 361/796; 361/799; 361/801; 361/686; 361/816; 361/818; 361/825; 439/630; 174/38 R; 174/35 GC
[58] Field of Search ...................................... 361/752, 753, 361/796, 816, 818, 825, 827, 686; 439/630; 174/35 R, 35 GC

[56] References Cited

U.S. PATENT DOCUMENTS

| | | | |
|---|---|---|---|
| 5,162,980 | 11/1992 | Morgan et al. | 361/818 |
| 5,233,507 | 8/1993 | Günther et al. | 361/816 |
| 5,396,405 | 3/1995 | Reed et al. | 361/827 |
| 5,770,822 | 6/1998 | Abolitz et al. | 174/35 GC |
| 5,980,324 | 11/1999 | Berg et al. | 439/630 |

OTHER PUBLICATIONS

Data Sheet for Prior Art Finisar Optical Gigabit Transceiver—Date Unknown.
Photograph of Prior Art Hewlett Packard Pluggable Transceiver—Date Unknown.
Drawing of Prior Art AMP Guide Assembly Model 787663, Apr., 1996.
Photographs of Prior Art AMP Guide Assembly.

*Primary Examiner*—Hyung-Sub Sough
*Assistant Examiner*—Tuan Dinh
*Attorney, Agent, or Firm*—Weingarten, Schurgin, Gagnebin & Hayes LLP

[57] ABSTRACT

A conductive panel adapted to align and retain a printed circuit board modular device carrier assembly. The assembly includes a printed circuit board and a plurality of modular electronic device carriers, each sized to slidably receive a modular electronic device such as a Gigabit Interface Converter. The panel includes at least two generally rectangular openings oriented in a row of opening. The openings are sized to permit the modular electronic device to be slidably disposed therethrough. At least one inwardly extending conductive finger is provided integral with the panel and generally orthogonal to the inner panel surface adjacent the bottom edge of the opening and at least one inwardly extending finger is provided integral with the panel generally orthogonal to the inner panel surface adjacent the upper edge of the opening. The upper and lower fingers securely retain the printed circuit board carrier assembly therebetween when the carrier assembly and panel are in assembled relation. Conductive ground contacts are selectively positioned on one side of the printed circuit board. The lower fingers abut the contacts so as to electrically couple the conductive panel to ground through the ground contacts.

15 Claims, 5 Drawing Sheets

PANEL HAVING FINGERS ADAPTED TO RETAIN PRINTED CIRCUIT BOARD MODULAR DEVICE CARRIER ASSEMBLY

CROSS REFERENCE TO RELATED APPLICATIONS

This application claims priority of U.S. Provisional Application No. 60/128,508, filed Apr. 9, 1999.

STATEMENT REGARDING FEDERALLY SPONSORED RESEARCH OR DEVELOPMENT

Not Applicable.

BACKGROUND OF THE INVENTION

The present invention relates to the packaging of electronic equipment and more particularly to an improved panel which provides for alignment and mounting of a printed circuit board within a housing.

Conventional electronic devices typically employ a housing which serves to contain and protect the device electronics. Often, card cages or other structures are integrally formed as a part of the housing or are provided within the housing to retain printed circuit boards, device electronics and modular electronic components. In many types of electronic equipment, including telecommunications equipment, it is necessary to make electrical or optical connections between communication links external to the device and components within the device. In this regard, openings are often provided within one or more panels in the housing to permit such connections to be made. The openings provide access to modular devices mounted to a printed circuit board behind the panel openings, such as port transceivers.

Alternatively, device carriers, such as transceiver carriers may be mounted on a printed circuit board such that transceivers may be inserted into their respective carriers through the openings provided in the panel. The transceivers may include optical or electrical ports for receiving corresponding optical or electrical cables and for coupling communications links to electronics with the device.

In such devices, it is desirable to provide packaging structures which permit ease of assembly, and which securely retain the printed circuit boards in the intended mounting position within the housing following assembly.

BRIEF SUMMARY OF THE INVENTION

A conductive panel for use in an electronic housing is disclosed. The panel includes an array of generally rectangular openings, each of the openings being defined by upper and lower edges and side edges. The openings are sized to receive the frontal portion of a carrier for a modular transceiver or other suitable electronic device carrier. The openings are arranged in rows. The panel has an outer surface which corresponds to an exterior surface of the finally assembled housing and an inner surface which corresponds to an interior surface of the finally assembled housing.

In a preferred embodiment, at least one integrally formed conductive lower finger extends from the inner surface of the panel adjacent the lower edge and at least one upper finger extends from the inner surface of the front panel adjacent the upper edge of each opening in the array of openings. The fingers have opposing surfaces which are spaced apart by a predetermined distance corresponding to the height of the frontal portion of a printed circuit board/ device carrier assembly. The upper and lower fingers include an end portion which is angled to help guide the carrier assembly into alignment during assembly.

As the panel is positioned on the front of the housing, the upper and lower fingers along a row of openings guide and capture the printed circuit board/carrier assembly. By retaining the assembly in the described manner, the fingers provide mechanical support for the respective edge of the printed circuit board carrier assembly. Additionally, vibration of the printed circuit board is reduced. Finally, to reduce EMI/RFI emissions from the housing, conductive ground contacts are selectively positioned on the underside of printed circuit board such that the conductive lower finger along the lower edge of each opening contacts a corresponding ground contact when the panel is mounted to the housing.

BRIEF DESCRIPTION OF THE SEVERAL VIEWS OF THE DRAWING

The invention will be more fully understood by reference to the following detailed description of the drawings in conjunction with the following drawings of which:

FIG. 3b is a rear perspective view of the panel of FIG. 3a;

DETAILED DESCRIPTION OF THE INVENTION

In accordance with the present invention, an improved panel is disclosed that serves to align and retain a printed circuit board/carrier assembly during and following mating of the panel to a housing. The panel retains the printed circuit board/carrier assembly so as to reduce vibration of the assembly during shipment and operation of the electronic device and provides a low impedance conductive path between the panel and the printed circuit board to reduce EMI/RFI emissions.

Figure 1:
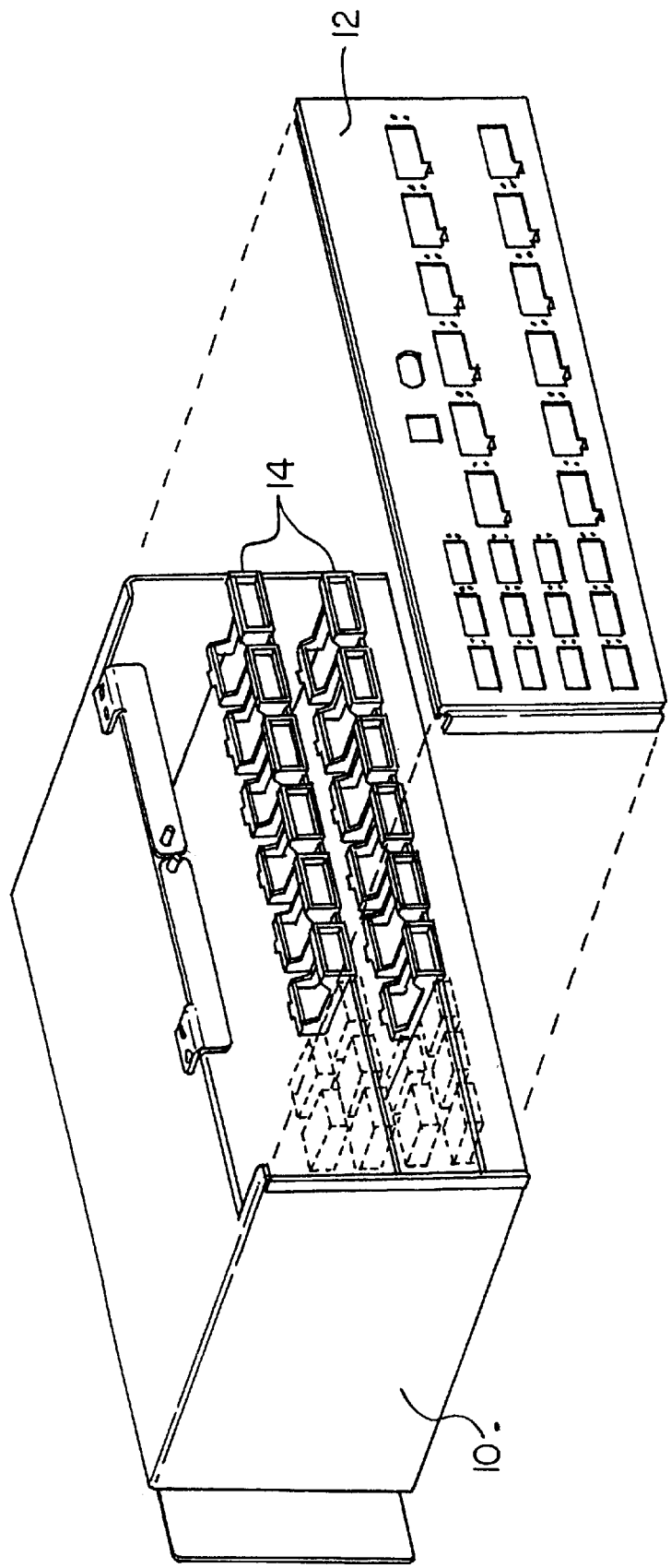
FIG. 1 is a perspective view of a housing for an electronic device adapted to receive a panel in accordance with the present invention.
Figure 2:
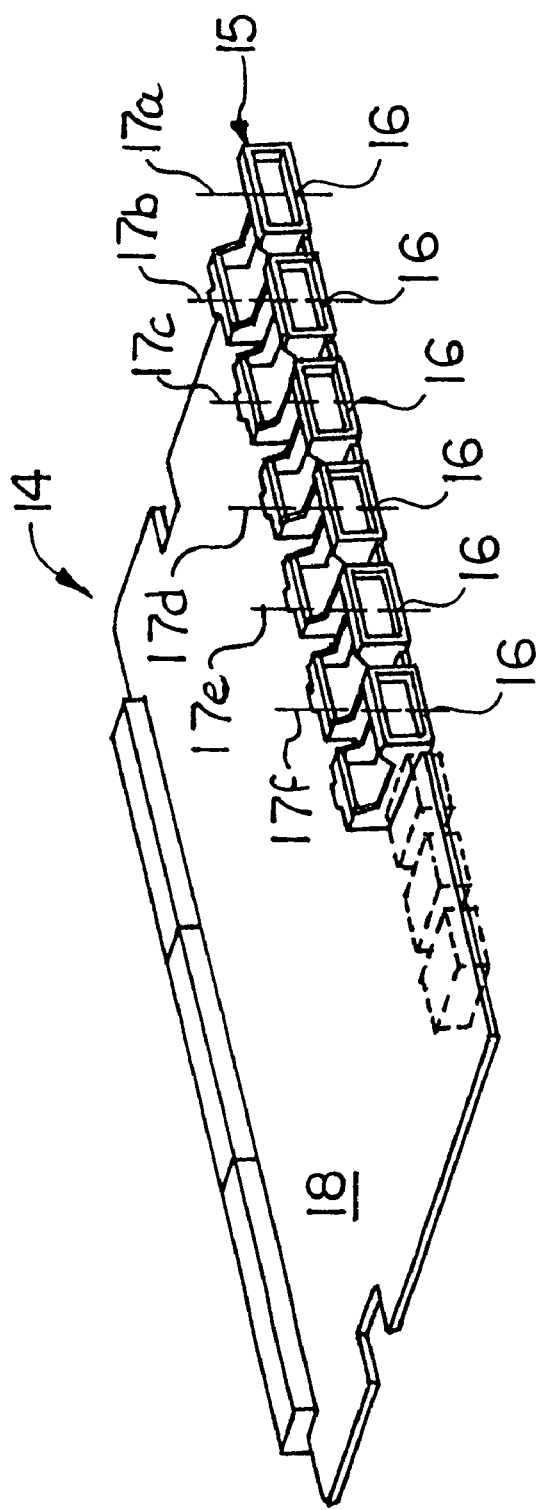
FIG. 2 is a perspective view of a printed circuit board having a plurality of modular device carriers mounted thereon and adapted for installation in the housing depicted in FIG. 1.

The panel and printed circuit board/carrier assembly are depicted in FIGS. 1–6. Referring to FIG. 1, an enclosure including a housing 10 is illustrated with a panel 12 removed. The panel 12 may be fastened to the housing 10 via the use of screws or any other suitable fasteners. The housing 10, which may comprise a card cage, includes a plurality of printed circuit board/carrier assemblies 14 disposed therein. As depicted with greater particularity in FIG. 2, each printed circuit board/carrier assembly 14 includes a plurality of carriers 16 that are fixably mounted to a printed circuit board 18 and adapted to receive a corresponding plurality of pluggable electronic modules 19 (see FIG. 5). The carriers 16 are selectively positioned and spaced with centerlines 17a, 17b, 17c, 17d, 17e, 17f such they align with centerlines 21a, 21b, 21c, 21d, 21e, 21f of openings provided in the panel 12 when the printed circuit board carrier assemblies 14 are mated with the panel 12. In a preferred embodiment of the invention, the pluggable electronic modules 19 comprise pluggable transceivers, such as the Gigabit Interface Converters available commercially from Finisar Corporation of Mountain View, Calif. The carriers 16 may comprise commercially available carriers sized and configured to slidably receive the pluggable transceivers, such as a Gigabit Interface Converter carrier, part number 787663, available from Amp Incorporated of Harrisburg, Pa.

Figure 3A:
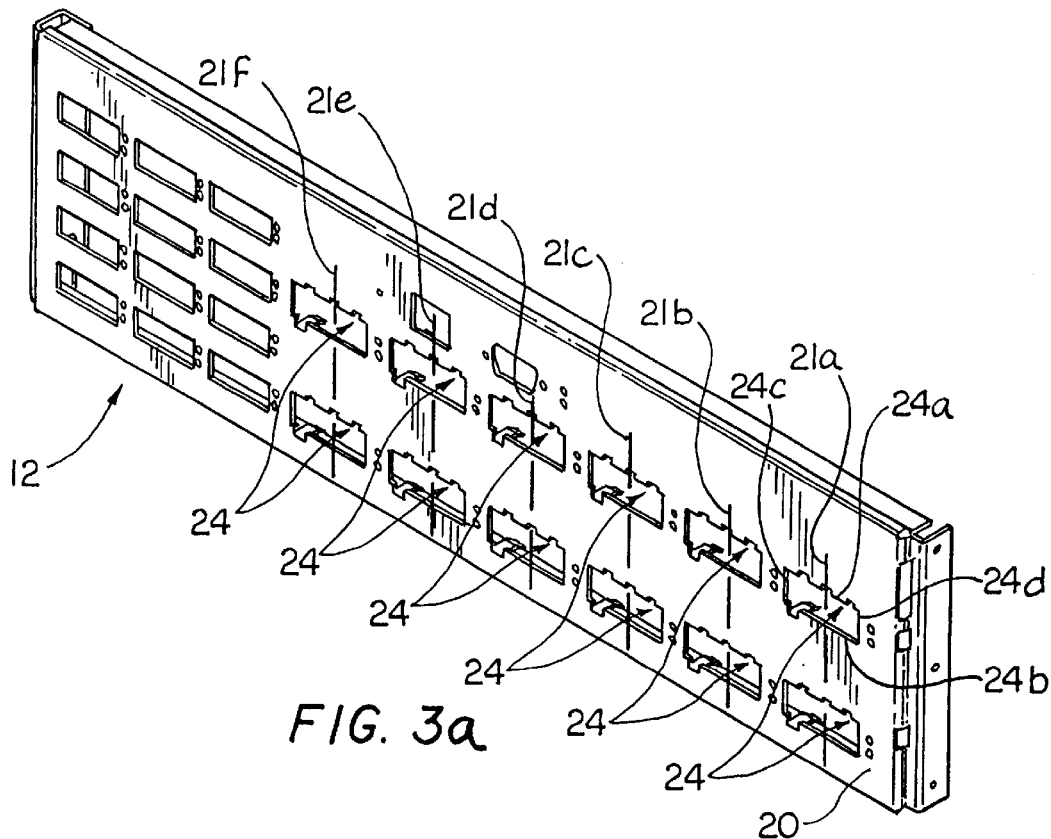
FIG. 3a is a front perspective view of a panel in accordance with the present invention adapted to mount to the housing of FIG. 1.
Figure 3B:
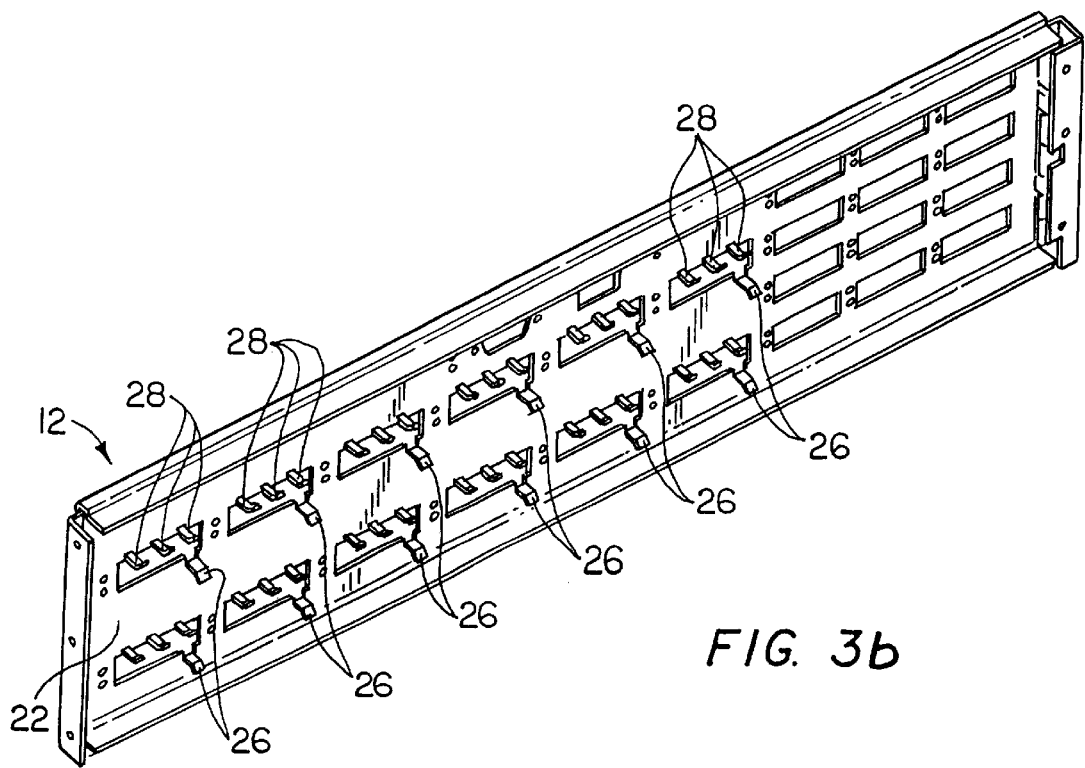

Referring to FIGS. 3a and 3b, the panel 12 has an exterior surface 20, an interior surface 22 and an array of openings 24. The openings 24 are defined by upper and lower edges 24a and 24b respectively and side edges 24c and 24d, are generally rectangular, and are intended to align with and receive the frontal portion 15 of the modular device carriers 16.

In the disclosed embodiment, the openings 24 are arranged in first and second rows, comprising an upper row and a lower row. Each of the rows of openings 24 includes a plurality of openings 24. While the disclosed panel 12 is illustrated as having two carrier rows, it will be understood that the panel 12 may include a single row or a plurality of rows depending upon the number of printed circuit board/carrier assemblies 14 to be accomodated.

Referring to FIG. 3b, the side of the panel which is intended to confront the printed circuit board/carrier assemblies 14 as shown. The panel 12 includes a lower finger 26 extending generally orthogonally from the interior surface 22 of the panel 12 adjacent to the lower edge of the respective opening. Additionally, the panel 12 includes a plurality of upper fingers 28 extending generally orthogonally from the interior surface 22 of the panel 12 adjacent to the upper edge of the respective opening. The upper and lower fingers 26 and 28 are integral with the panel. It will be understood that the number of upper and lower fingers may be varied depending upon the application so long as there are at least two upper fingers and two lower fingers within each row, and the two upper and lower fingers are adjacent different openings.

Figure 4:
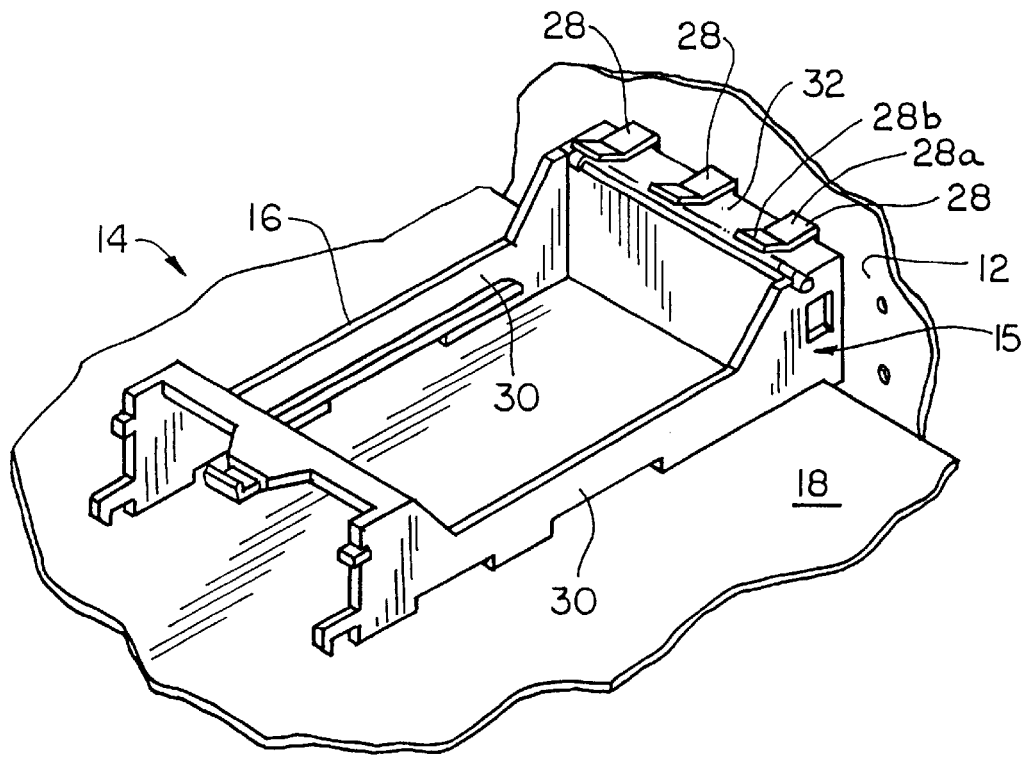
FIG. 4 is a perspective view of a portion of a printed circuit board carrier assembly illustrating the assembly seated against the panel.
Figure 6:
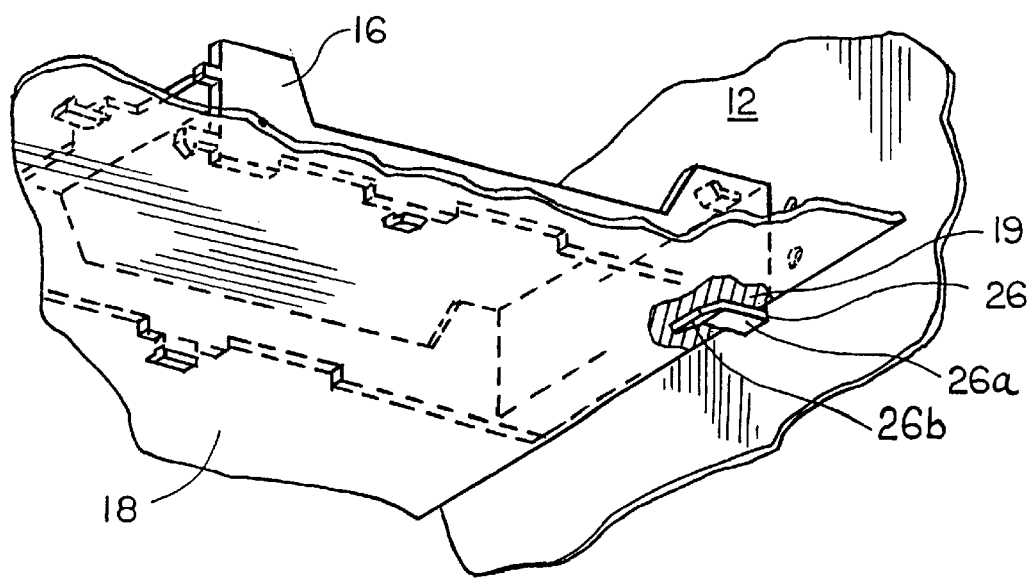
FIG. 6 is a perspective view of a portion of the bottom side of the printed circuit board/carrier assembly in a seated position against the panel.

A vertical spacing is provided between the upper and lower fingers which is specified to accommodate the height of the carrier assembly 14. More specifically, in a preferred embodiment, the dimension of the vertical spacing between the upper and lower fingers 26 and 28 is specified to equal the distance from the bottom surface of the printed circuit board 18 to the top surface of the frontal portion of the carrier 16. Thus, when the printed circuit board assembly 14 is mated with panel 12, it is securely retained between the respective upper and lower fingers as depicted in FIGS. 4 and 6. By retaining the carrier assembly in the above-described manner, vibration of the carrier is minimized once the panel 12 is mated with the carrier assemblies 14 and the housing 10 in assembled relation.

The carrier assembly 14 is shown in FIG. 4 in assembled relation with the panel 12. The carrier 16 comprises an integrally formed structure having a frontal portion mechanically coupled to a rear portion by first and second side members 30. The frontal portion includes an upper crossbar 32 and a lower crossbar (not visible) which are coupled by the integral side members 30. The upper and lower crossbars, in combination with the side members 30 define a frontal carrier opening sized to receive the electronic module 19.

The deformation of the upper crossbar 32 of the carrier 16 can permit foreign objects to be inserted into the housing. For example, if one were to attempt to insert a finger into carrier, such might result in the deformation of and damage to the carrier 16 and, additionally, pose a risk of danger of coming into contact with live voltages within the housing. To prevent possible damage to the carrier 16 and the above-described risks, plural upper fingers 28 are provided. The plural upper fingers 28 abut the upper crossbar 32 of the carrier 16 when the panel 12 is mated to the carrier assembly 14, provide support for the upper crossbar 32, and prevent upward deflection of the upper crossbar. In this manner the risks associated with deformation and damage to the carrier and personal injury are reduced.

Figures 5, 5A:
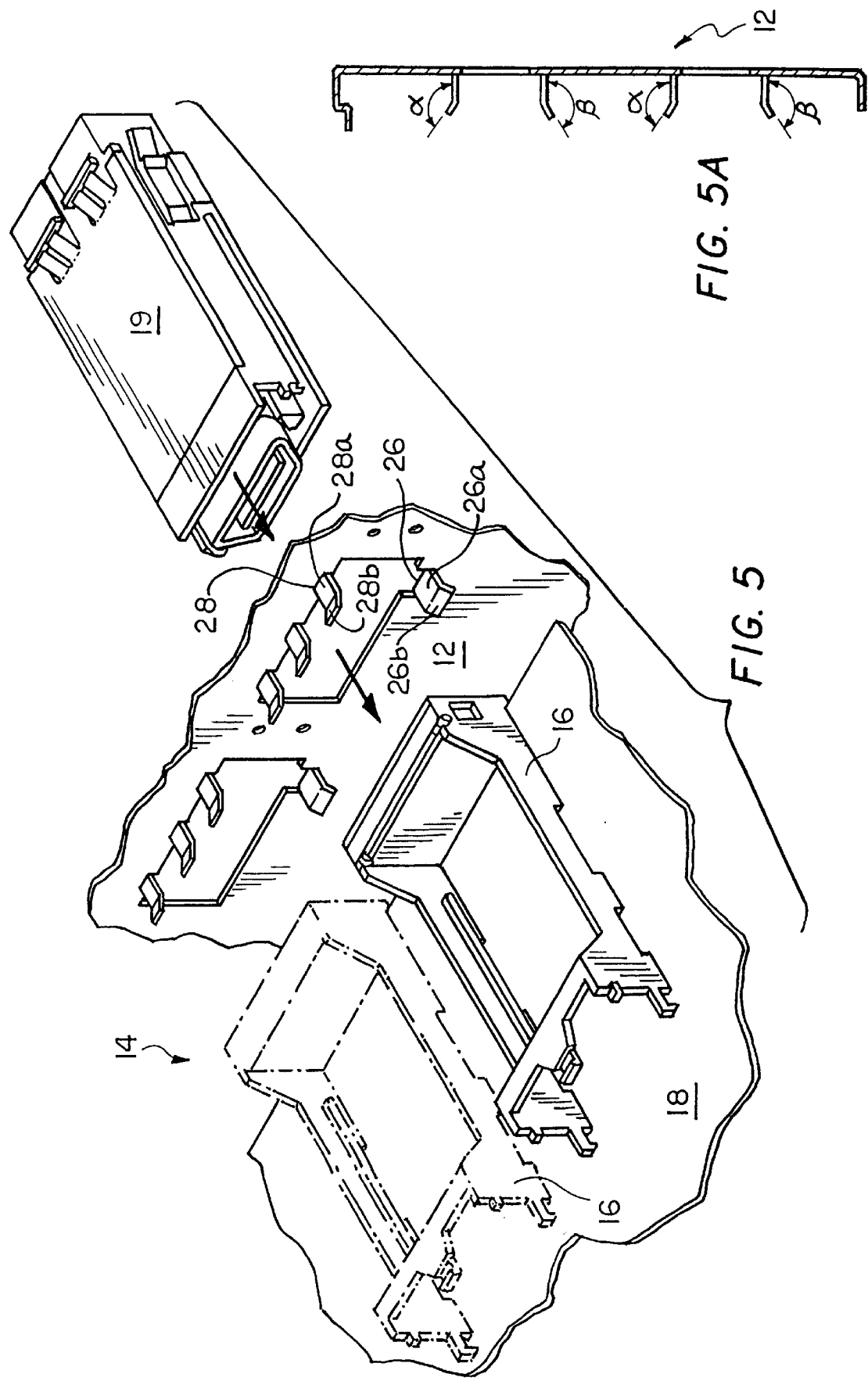
FIG. 5 is a perspective exploded view of a portion of the printed circuit board/carrier assembly and panel in accordance with the present invention depicting a plurality of carriers within a single row mounted on the printed circuit board.
FIG. 5a is a side cross-sectional view of the panel illustrating the upper and lower fingers.

Referring to FIGS. 4, 5 and 5a, the upper fingers 28 include a support portion 28a and a guide portion 28b. The support portions 28a of the upper fingers 28 provide support for the upper crossbar 32 of the carrier 16 as described above. The upper finger guide portion 28b is angled by an angle of $\alpha$ which, in a preferred embodiment is approximately 165° with respect to the upper finger support portion 28a. Similarly, the lower fingers 26 include a lower finger contact portion 26a and a lower finger guide portion 26b. The lower finger guide portion 26b is angled at an angle $\beta$ degrees with respect to the lower finger contact portion 26a. In a preferred embodiment, the angle $\beta$ is approximately 165 degrees. The upper and lower finger guide portions 28b and 26b serve to guide the panel into an aligned position in which the upper and lower fingers 28 and 26 retain the respective carriers and printed circuit board between the upper finger support portions 28a and the lower finger contact portions 26a. It should be appreciated that the angle between the upper finger support portion and the upper finger guide portion may be varied. Similarly, the angle between the lower finger contact portion and the lower finger guide portion may be varied.

In a preferred embodiment of the presently disclosed panel, the lower finger extends from the interior surface 22 farther than the upper fingers. Thus, during the mating of the panel 12 to the housing 10, the guide portion 26b of the lower finger 26 is likely to first come into contact with the adjacent edge of the printed circuit board/carrier assembly 14 and guide the printed circuit board/carrier assembly into the intended aligned position. More particularly, in one embodiment, the length of the lower fingers is 0.342 inch and the length of the upper fingers is 0.310 inch. Additionally, by way of example, the vertical distance between fingers in one embodiment is 0.636 inch. It should be recognized however, that the spacing between the upper and lower fingers is selected to accommodate the particular printed circuit board thickness and the particular modular electronic device carrier being employed.

Further, as depicted in FIG. 4, the frontal portion of the carrier 16 extends slightly beyond the edge of the printed circuit board 18. The extending frontal portion is seated within the openings 24 of the panel 12 when the printed circuit board carrier and panel 12 are in assembled relation. The seating of the frontal portion of the carriers within respective openings of the panel assures horizontal alignment of the printed circuit board/carrier assembly with respect to the panel and assists in securely retaining the printed circuit board/carrier assembly in its final aligned position within the housing 10.

Conductive contacts or pads are provided on the bottom side of the printed circuit board 18 and positioned such that the conductive lower finger contact portion 26a contacts the pad when the panel 12 is in its assembled position with respect to the housing and the printed circuit board/carrier assembly 14. More particularly, a conductive contact or pad 19 is positioned above the contact portion 26a of each of the lower fingers 26 such that the lower finger 26 abuts the conductive contact 19 and electrically couples the panel 12 to the conductive contact. The conductive contact is coupled through printed circuit board etch to ground potential in an operational system so as to provide a low impedance path between the panel, the printed circuit board, and device ground. By providing grounding of the panel in the above-described manner, EMI and RFI emissions are reduced.

FIG. 5 illustrates the retention of the carrier assembly between upper and lower fingers 28 and 26 of multiple openings 24. Since the printed circuit board carrier assembly 14 is retained by a plurality of upper and lower fingers across the width of the printed circuit board, the printed circuit board/carrier assembly is securely retained by the panel 12 fingers 26 and 28 following assembly of the panel 12 to the housing 10.

It will be appreciated by those of ordinary skill in the art that variations of and modifications to the above-described panel and carrier assembly may be made without departing from the inventive concepts described herein. Accordingly, the invention should not be viewed as limited except as by the scope and spirit of the appended claims.

What is claimed is:

1. Apparatus for retaining a printed circuit board carrier assembly in a mounting position, said printed circuit board carrier assembly including a printed circuit board having a first edge and a plurality of modular device carriers mounted to said printed circuit board along said first edge and having predetermined carrier centerline spacings, wherein said printed circuit board carrier assembly has a predetermined height and said carriers have a frontal portion, said apparatus comprising:

a panel having a plurality of openings arranged in at least one row wherein each such opening is defined generally by a top edge, a bottom edge and two side edges, and wherein said panel has an inner housing surface and an outer housing surface, said openings having opening centerline spacings corresponding to said predetermined carrier centerline spacings;

at least one lower finger integral with said panel and extending generally orthogonally from said inner surface adjacent to said lower edge of each one of said plurality of openings in said at least one row;

at least one upper finger integral with said panel and extending generally orthogonally from said inner surface adjacent to said upper edge of each one of said plurality of openings in said at least one row;

said at least one upper and lower fingers being vertically spaced apart substantially by said predetermined height to capture said printed circuit board carrier assembly between said at least one upper and lower fingers when said printed circuit board carrier assembly is disposed in said mounting position.

2. The apparatus of claim 1 wherein said panel and said at least one lower finger are electrically conductive.

3. The apparatus of claim 1 wherein said panel includes three upper fingers integral with said panel and extending generally orthogonally from said inner surface adjacent to said upper edge of each one of said plurality of openings in said at least one row.

4. The apparatus of claim 1 wherein said apparatus includes a single lower finger adjacent to said lower edge of each one of said plurality of openings in said at least one row.

5. The apparatus of claim 1 wherein said at least one lower finger includes a contact portion and a guide portion extending and angled downward from said contact portion, said at least one lower finger having a first length.

6. The apparatus of claim 5 wherein said at least one upper finger includes a carrier support portion and a carrier guide portion extending and angled upward from said carrier support portion, said at least one upper finger having a second length.

7. The apparatus of claim 6 wherein said first length is greater than said second length.

8. The apparatus of claim 1 wherein the openings in said panel are sized to receive the frontal portion of respective carriers.

9. The apparatus of claim 1 wherein said modular device carriers comprise Gigabit Interface Converter carriers and said predetermined height is selected to accommodate said Gigabit Interface Converter carriers.

10. An electronic packaging assembly comprising:

a housing;

a printed circuit board having a first edge, said printed circuit board disposed in a printed circuit board mounting position within said housing;

a plurality of modular device carriers having frontal portions, said modular device carriers mounted at predetermined carrier centerline spacings along said printed circuit board first edge, said printed circuit board and said mounted carriers forming a printed circuit board carrier assembly having a predetermined height;

a panel mounted to said housing in a panel mounting position, said panel having an inner surface and including a plurality of openings arranged in at least one row wherein said openings are defined generally by a top edge, a bottom edge and two side edges in said panel, said openings having opening centerline spacings corresponding to said predetermined carrier centerline spacings, said panel further including at least one lower finger integral with said panel and extending generally orthogonally from said inner surface adjacent to said lower edge of each one of said plurality of openings in said at least one row, and at least one upper finger integral with said panel and extending generally orthogonally from said inner surface adjacent to said upper edge of each one of said plurality of openings in said at least one row, said at least one upper and lower fingers being spaced apart by said predetermined height, said printed circuit board carrier assembly being retained between said at least one upper and lower fingers.

11. The electronic packaging assembly of claim 10 wherein said panel and said at least one lower finger is electrically conductive, and wherein at least one conductive ground contact is selectively disposed on a bottom side of said printed circuit board so that said at least one lower finger contacts said at least one conductive ground contact when said printed circuit board is disposed in said printed circuit board mounting position and said panel is mounted to said housing in said panel mounting position.

12. The electronic packaging assembly of claim 10 wherein said modular device carriers comprise Gigabit Interface Coverter carriers sized and configured to receive Gigabit Interface Converters.

13. A method for restricting vertical movement of a printed circuit board carrier assembly with respect to a panel, wherein said printed circuit board carrier assembly includes a printed circuit board and a plurality of modular electronic device carriers having carrier centerline spacings, said modular electronic device carriers being mounted to said printed circuit board along one edge thereof with predetermined carrier centerline spacings between adjacent carriers, said printed circuit board carrier assembly having a height, said method comprising the steps of:

mounting said panel with respect to said printed circuit board carrier assembly in a mounting position, said panel having a plurality of openings, wherein said openings have opening centerlines spaced apart by said carrier centerline spacings, said openings being defined by upper and lower edges and side edges, said panel including at least one first finger adjacent the upper edge of each one of said openings and extending generally orthogonally from a first surface of said panel and at least one second finger adjacent the lower edge of each one of said openings and extending generally orthogonally from said first surface, said first and second fingers having a vertical spacing therebetween generally equal to said printed circuit board carrier assembly height; and retaining said printed circuit board carrier assembly along said one edge between said first and second fingers.

14. The method of claim 13 wherein said panel and said lower fingers are conductive, said method further comprising the step of:

conductively coupling said panel to conductive ground contacts selectively disposed on said printed circuit board via said second fingers.

15. The method of claim 13 wherein said modular device carriers comprise Gigabit Interface Converter carriers sized and configured to receive Gigabit Interface Converters.

* * * * *